United States Patent
McClelland et al.

(10) Patent No.: US 6,313,461 B1
(45) Date of Patent: Nov. 6, 2001

(54) SCANNING-APERTURE ELECTRON MICROSCOPE FOR MAGNETIC IMAGING

(75) Inventors: Gary Miles McClelland, Palo Alto; Charles Thomas Rettner, San Jose; Mahesh Govind Samant, San Jose; Dieter Klaus Weller, San Jose, all of CA (US)

(73) Assignee: International Business Machines Corp., Armonk, NY (US)

( * ) Notice: Subject to any disclaimer, the term of this patent is extended or adjusted under 35 U.S.C. 154(b) by 0 days.

(21) Appl. No.: 09/272,289

(22) Filed: Mar. 19, 1999

(51) Int. Cl.[7] .................................................. H01J 37/252
(52) U.S. Cl. .......................... 250/306; 250/307; 250/305; 250/310
(58) Field of Search ..................................... 250/306, 307, 250/305, 310, 311, 423 P

(56) References Cited

U.S. PATENT DOCUMENTS

| | | | |
|---|---|---|---|
| 3,758,778 | * | 9/1973 | Braunlich ............................. 250/307 |
| 4,096,386 | * | 6/1978 | Rempfer et al. ..................... 250/306 |
| 4,764,674 | * | 8/1988 | Kinoshita ............................ 250/306 |
| 5,041,724 | * | 8/1991 | Feuerbaum et al. ................ 250/306 |
| 5,266,809 | * | 11/1993 | Engel .................................. 250/306 |
| 5,278,406 | * | 1/1994 | Kinoshita ............................ 250/306 |
| 5,446,282 | | 8/1995 | Kawata et al. . |
| 5,508,627 | | 4/1996 | Patterson . |
| 5,581,082 | | 12/1996 | Hansma et al. . |

OTHER PUBLICATIONS

Kouichi Tsuji et al., X–Ray Excited Current Detected with Scanning Tunneling Microscope Equipment, Jpn. J. Appl. Phys., vol. 34 (1995) pp. L 1506–L 1508, Part 2, No. 11A, Nov. 1, 1995.

* cited by examiner

*Primary Examiner*—Kiet T. Nguyen
(74) *Attorney, Agent, or Firm*—Thomas R. Berthold, Esq.; Banner & Witcoff, Ltd.

(57) ABSTRACT

A scanning-aperture electron microscope system and method in which a radiation source generates a radiation beam that is incident upon a surface of a sample material causing electrons to be ejected from the surface. When magnetic imaging is being performed, a polarization rotator polarization-modulates the radiation beam. A scanning-aperture probe having an aperture is positioned in proxiity to the surface of the sample material so that photoelectrons ejected from the surface of the sample material pass through the aperture. A detector detects the electrons passing through the aperture. The electron detector outputs a signal in response to the detected electrons that is used for imaging magnetic and/or spectroscopic features of the surface of the sample material. The resolution of the imaged features is about equal to a size of the aperture.

30 Claims, 4 Drawing Sheets

SCANNING-APERTURE ELECTRON MICROSCOPE FOR MAGNETIC IMAGING

BACKGROUND OF THE INVENTION

1. Field of the Invention

The present invention relates to the field of electron microscopy. More particularly, the present invention relates to a system and a method for magnetic and spectroscopic imaging.

2. Description of the Related Art

Magnetic media presently used for disk drives are thin films that have grains that are about 15 nm across. Soon the grain size will be under 10 nm. To better understand how the magnetic microstructure of the media affects magnetic recording processes, magnetic imaging having a resolution of less than 5 nm is required. Currently, only transmission electron microscopy (TEM) provides an imaging resolution that is on the order of 5 nm. TEM, however, is limited by requiring a sample to be processed to be about 100 nm thick. Further, TEM is insensitive to ultra-thin films, that is, films, that are on the order of 20 nm thick or less.

Many techniques have been developed for extracting various types of image information from a scanning probe microscope (SPM). One technique uses a scanning near-field optical probe, but has a low efficiency for collecting emitted photons. Collection efficiency is improved by using photoemission so that electrons are emitted from the surface of a sample and collected using a positively-biased scanning probe, such as disclosed by K. Tsuji et al., X-Ray Excited Current Detected with Scanning Tunneling Microscope Equipment, Jpn. J. Appl. Phys, Vol, 34, pp. LI 506–LI 508, 1995. Nevertheless, this approach is limited by the noise of the collection current amplifier (Johnson noise). Another limiting factor with this approach in practice is an interfering signal caused by emission from the scanning tip. There are also difficulties associated with sufficiently limiting the collecting area for achieving good spatial resolution.

Stohr et al., Element-specific Magnetic Microscopy Using Circularly Polarized X-rays, Science, Vol. 259, p. 658, 1993, discloses a photoemission microscope that is capable of magnetic imaging by using conventional electron microscope optics for imaging photoemitted electrons. This approach efficiently collects electrons and has a theoretical resolution of about 10 nm, but the high voltages inherent in this approach makes the microscope susceptible to breakdown and arcing.

What is needed is a technique having nm-scale resolution for imaging magnetic and spectroscopic features that does not require sample thinning and can image an ultrathin film without the application of high voltages,

SUMMARY OF THE INVENTION

The present invention provides a technique having nm-scale resolution for imaging magnetic and spectroscopic features and does not require sample thinning and can image an ultrathin film. The advantages of the present invention are provided by a scanning-aperture electron microscope system and method in which a particle or radiation source generates a beam that causes electrons to be ejected from the sample material. The preferred embodiment employs a radiation source such that a laser, or synchrotron beams to cause photoemission of electrons from the target. For this preferred radiation source, magnetic imaging is performed by using a polarization rotator to polarization the incident beam. Alternative radiation beams that can be used include electrons, ions, x-rays, visible and ultraviolet light.

A scanning-aperture probe having an aperture is positioned in proximity to the surface of the sample material so that some of the photoelectrons emitted from the surface of the sample material pass through the aperture. An electron detector detects the photoelectrons that pass through the aperture. The electron detector outputs a signal in response to the detected photoelectrons that is used for imaging magnetic and/or spectroscopic features of the surface of the sample material According to the invention, the resolution of the imaged features is about equal to the size of the aperture.

In one embodiment of the present invention, an optical element can be disposed between the aperture of the scanning-aperture probe and the electron detector and a barrier having a pinhole is disposed between the optical element and the electron detector. The optical element and the pinhole operate together for directing photoelectrons emitted from the surface of the sample material having a predetermined electron energy and having a predetermined emission path to the electron detector. In another embodiment of the present invention, a measurement controller can be used to generate a trigger signal in response to a magnetic field pulse event that is applied to the surface of the sample material. For this embodiment, the radiation source is responsive to the trigger signal by generating a pulsed emission radiation been so that an image having known temporal relationship with the rapid magnetic field pulse can be generated.

BRIEF DESCRIPTION OF THE DRAWING

The present invention is illustrated by way of example and is not limited the accompanying figures in which like reference numerals indicate similar elements an which:

FIG. 2A shows an enlarged cross-sectional view of the vertex portion of the exemplary scanning-aperture probe of FIG. 2;

FIG. 4b shows a line scan taken from the image shown in FIG. 4a.

DETAILED DESCRIPTION

The present invention provides a system and a method having nm-scale resolution that is for imaging magnetic and spectroscopic features. The present invention does not require sample thinning, and can image an ultrathin film. Fairly rough samples can be imaged because the present invention does not require an asperity to protrude to near-contact as is required by STM. The present invention also provides a photoemission scanning probe microscopy system and method having high spatial resolution, high detection efficiency and low noise.

Magnetic contrasting is obtained by comparing photoelectron flux emitted from a given sample region for different polarizations of the incident light that causes photoemission. Particular elemental components can be magnetically imaged by using X-ray radiation that is tuned to a specific absorption feature. The concentration of specific elements or even certain types of bonds can also be imaged. Features of particular atomic core states and molecular orbitals can be imaged using photoemission excitation spectra of X-ray and far ultraviolet (UV).

Figure 1:
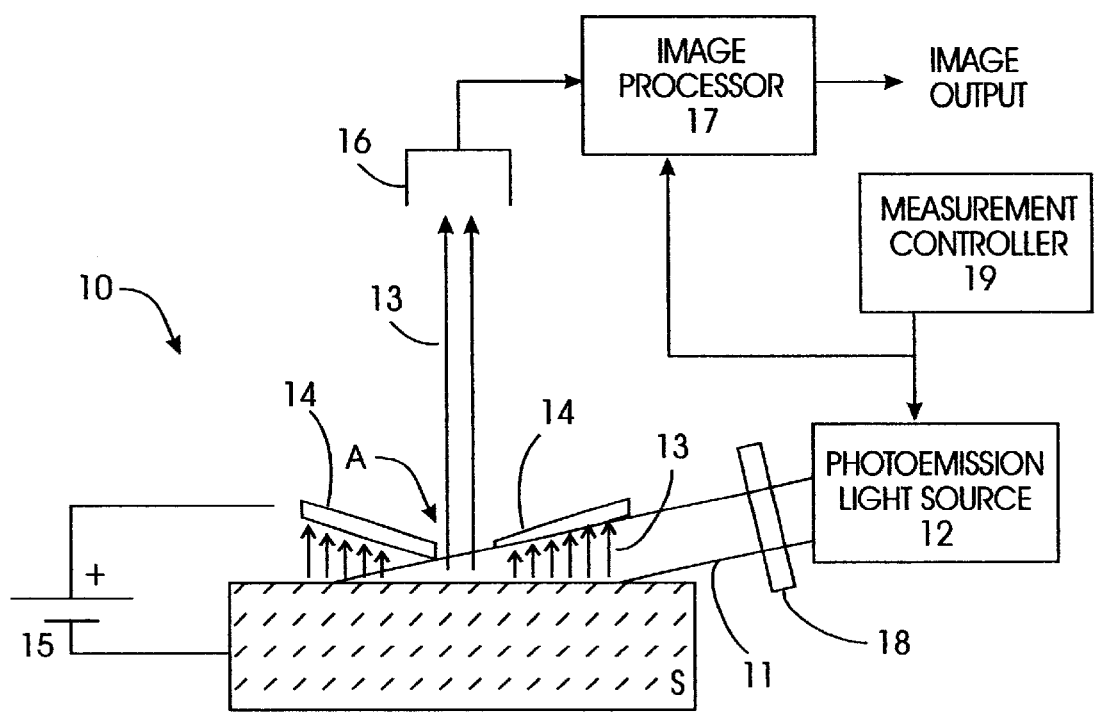
FIG. 1 shows one preferred embodiment of a photoemission scanning aperture probe microscope system according to the present invention.

FIG. 1 shows a photoemission scanning-aperture probe microscope system 10 according to the present invention. Light 11 from a photoemission light source 12 is focused onto a region of a sample S that is selected to be imaged. There is no requirement for sample S to be thinned prior to imaging. Light 11 causes photoemission of electrons 13 from the surface of sample S over a region that is 1 to 100 microns across depending upon the size of the focus spot of light 11. Spatial resolution is obtained by detecting only electrons emitted from a 1 to 500 nm sized region of the surface of sample S by scanning an aperture A of a scanning aperture probe 14 over sample S in three dimensions. A representative cross-sectional view of probe 14 is shown in FIG. 1. Probe 14 is biased positively in a well-known manner with respect to sample S by 1 to 10 V by bias source 15. A photoelectron detector 16 detects emitted electrons 13 that pass through aperture A. Photoelectrons can be detected with nearly 100% efficiency using an electron multiplier, such as a microchannel plate and a current amplifier. Photoelectron detector 16 outputs a signal in response to the detected photoelectrons that is used by an image processor 17 for imaging magnetic and/or spectroscopic features of the surface of the sample S using well-known image generating techniques.

In FIG. 1, light 11 is shown as being directed onto the surface of sample S from an oblique angle. Alternatively, sample S can be illuminated by light 11 directly from above sample S, that is, along a path that is perpendicular to the surface of sample S, through an optically transparent probe tip, or from below sample S through a transparent supporting substrate.

When magnetic imaging is performed, the magnetization of sample S determines whether a circularly polarized beam of light 11 must impinge perpendicularly or nearly parallel to the surface of sample S. Left- and right-handed circularly-polarized light generally yields respectively different photoemission intensities that is related to the relative orientation of a magnetic domain. The difference in the polarization dependence of adjacent domains yields a magnetic contrast by, for example, subtracting images obtained using left- and right-handed circularly-polarized light. For visible and near-UV light, the polarizations can be modulated using an electro-optic modulator, such as Pockets cell (polarization rotator 18 in FIG. 1), or by splitting the beam into polarization components, chopping and recombining the beam. For synchronous X-rays, the polarization can be generated by selecting polarization components that are angularly separated as the components are generated.

Light source 12 can be a continuous-wave laser that provides visible light, such as an argon or krypton ion laser. Alternatively, light source 12 can be a picosecond or a femtosecond pulsed laser source, particularly for visible and near-UV radiation, that is used for multiphoton photoemission. Such low-energy radiation will only generate photoemission from relatively low work function surfaces. As used herein, the phrase "work function" refers to an amount of energy that is required to "free" an electron from the surface of a sample when the sample is irradiated by a beam of light or radiation having a given frequency.

For higher work function sur s, light source 12 preferably generates ultraviolet light that can be obtained by frequency doubling the output of a visible laser, for sample, by conversion of a 458 nm argon ion light to 229 nm. For even higher work function surfaces, synchrotron radiation, or radiation from a free electron laser can be used, thus permitting photoemission from any surface and permitting the possibility of obtaining elemental specificity using X-ray photoelectron spectroscopy. If necessary, the surface of sample S can be modified to lower the work function by applying an alkali metal, such as cesium, by evaporation, for example. An overcoating of a non-magnetic layer does not prevent imaging, as long as the underlying magnetic material can be selected by tuning the wavelength of the photoemission radiation.

Table 1 lists some suitable exemplary light sources and their respective energies.

| Wavelength (nm) | Source | Energy (eV) | Comments |
| --- | --- | --- | --- |
| 514 | Argon ion laser | 2.4 | Cs surface treatment needed |
| 325 | Helium cadmium laser | 3.8 | Treatment with an alkali |
| 229 | Doubled 458 nm from AR ion | 5.4 | No treatment needed for most metals |
| 50 | Synchrotron radiation | 24.6 | Photoemission from any surface |
| ~1–5 | Synchrotron radiation | ~1000 | Elemental specificity via XPS |

The imaging technique of the present invention is capable of extremely short time resolution when a pulsed light source is used because photoemission is a rapid process that occurs within about 10 femtoseconds from the time the surface of a sample is radiated with photoemission light. Consequently, the magnetization change of a material in response to a rapid magnetic field pulse can be imaged by inducing photoemission using a pulsed laser that can be triggered by the occurrence of a magnetic field pulse event applied to sample S. FIG. 1 shows a measurement controller 19 that generates a trigger signal that triggers light source 12 to generate a pulse of photoemission light with an adjustable delay after the rapid magnetic field pulse. Measurement controller 19 also triggers image processor 17 for generating an image having a known temporal relationship with the rapid magnetic field pulse.

Figure 2:
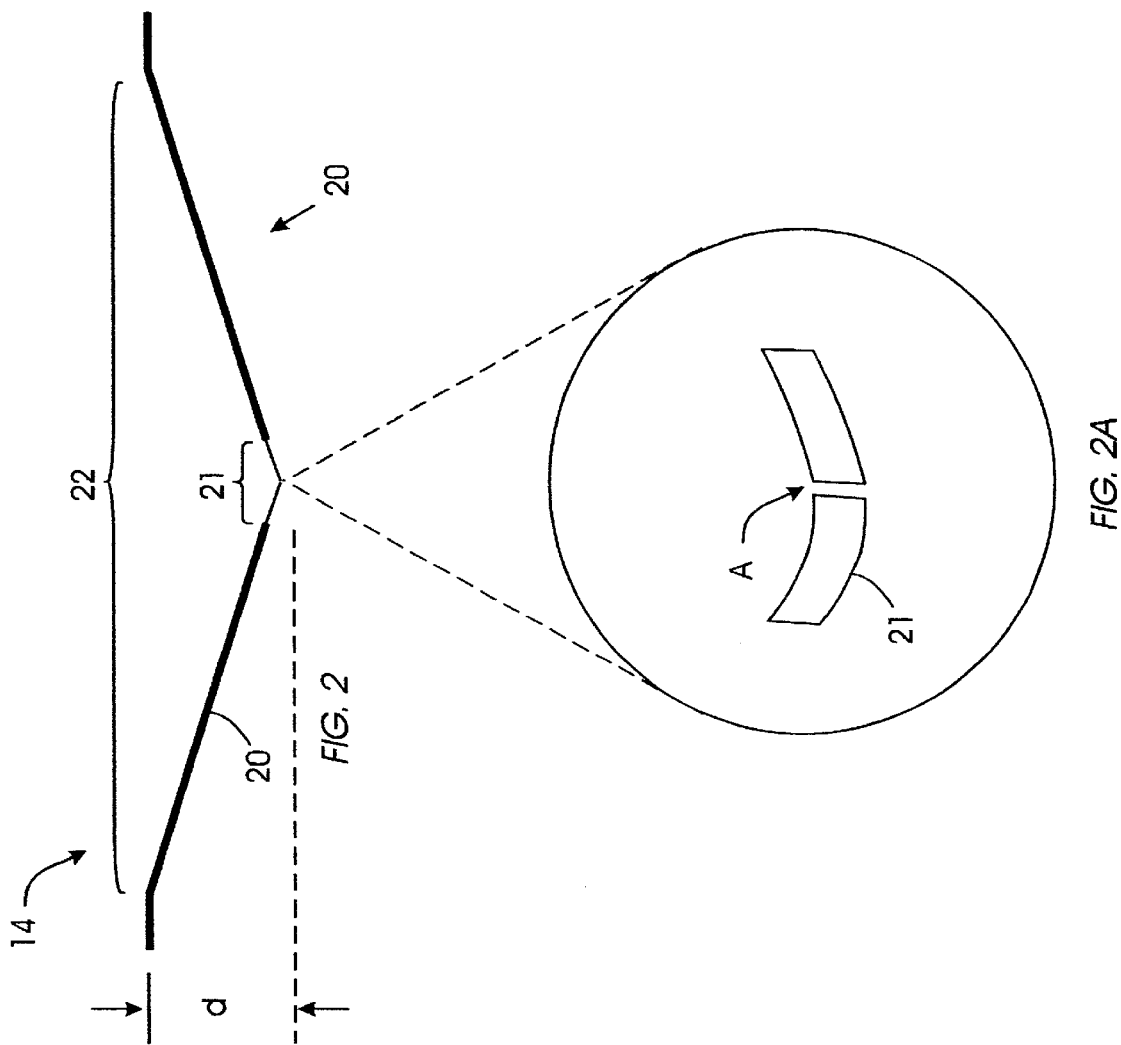
FIG. 2 shows a cross-sectional view of a tip portion of an exemplary scanning-aperture probe according to the present invention.

Spatial resolution is provided by detecting only the photoelectrons that pass through aperture A in scanning aperture probe 14 and that are incident upon photoelectron detector 16. FIG. 2 shows a cross-sectional view of a tip portion of an exemplary scanning-aperture probe 14 according to the present invention. Preferably, the tip portion of probe 14 is conically shaped and includes a relatively thick region 20 and a relatively thin vertex region 21. Of course, other shapes are possible for the tip portion of probe 14. Thick region 20 provides structural support for thin vertex region 21. The base 22 of thick region 20 is preferably about 2 mm in diameter and preferably the distance d from base 22 to vertex region 21 is about 0.6 mm.

FIG. 2A shows an enlarged cross-sectional view of the vertex region 21 that has been magnified with respect to FIG. 2 by about 10,000 times. Thin vertex region 21 preferably is formed from a metal, such as gold., and preferably has a thickness similar to the aperture diameter. Aperture A is fabricated at the vertex of probe 14 using, for example, a focused ion beam (FEB). FIBs are able to drill holes having a diameter of as small as 5 nm and apertures having this diameter are being developed.

As a photoemitted electron passes near the wall of aperture A, the electron is attracted to the wall by the image force of the electron. For a low-energy electron, the image force can be sufficiently large to attract the electron into the wall so that it is not transmitted to photoelectron detector 16. Thus, the effective size of an aperture can be much less than its physical diameter. For example, for electrons having an energy of 0.1 eV that enter an aperture that is 80 nm wide and 120 nm long, only the electrons entering the aperture within half of a radius of the center will not be pulled to the aperture wall. For apertures sizes on the order of 10 nm diameter, the image force can be so large that only electrons entering the aperture directly in the center of the aperture will not be pulled to one side. Thus, the image resolution obtained by the present invention is at least as small as the size of the aperture.

During scanning, aperture A is kept a fixed distance from the surface of sample S by controlling the position of probe 14 using a positioning system that is based on: a) the tunnel current between the probe tip and the surface of sample S, b) an optical interference signal; and/or c) the capacitance between probe 14 and the surface of sample S. In many cases when the tunnel current between the surface of sample S and the tip of probe 14 is monitored for controlling the surface tip distance, the photoemission current between the sample and tip (not just the electrons passing through aperture A) will be much greater than the tunnel current. When the work function of sample, but not the tip, is sufficiently low for allowing photoemission, the tunnel current can be measured without interference by briefly pulsing bias source 15 so that sample S becomes positive and photoemission temporarily ceases. Alternatively, the laser or photoemission radiation may be blocked or interrupted for the period of the tunnel-current measurement.

In many cases, there will be a strong interfering signal from electrons photoemitted from the tip of probe 14 that strike photoelectron detector 16. Because sample S is negatively biased with respect to probe 14, the electrons from the tip of probe 14 can be eliminated by a imposing a retarding potential between the tip of probe 14 and photoelectron detector 16 that allows only relatively higher-energy electrons to be transmitted from sample S to detector 16.

Electrons that are emitted from the surface of sample S are usually not those directly excited by the incident light. In general, the emitted electrons are excited by one or more inelastic processes and, even in the case of high energy X-ray excitation, leave the surface of sample S having a distribution of energies that are on the order of 1 eV. Because the emitted electrons are generated from a very small region at low energies, these electrons form a high-brightness source that is ideal for further electron optical manipulation. For example, optical elements can be inserted between probe 14 and photoelectron detector 16 for confining electron detection to electrons passing through aperture A that have limited angular and energy spread for providing improved spatial resolution.

Figure 3:
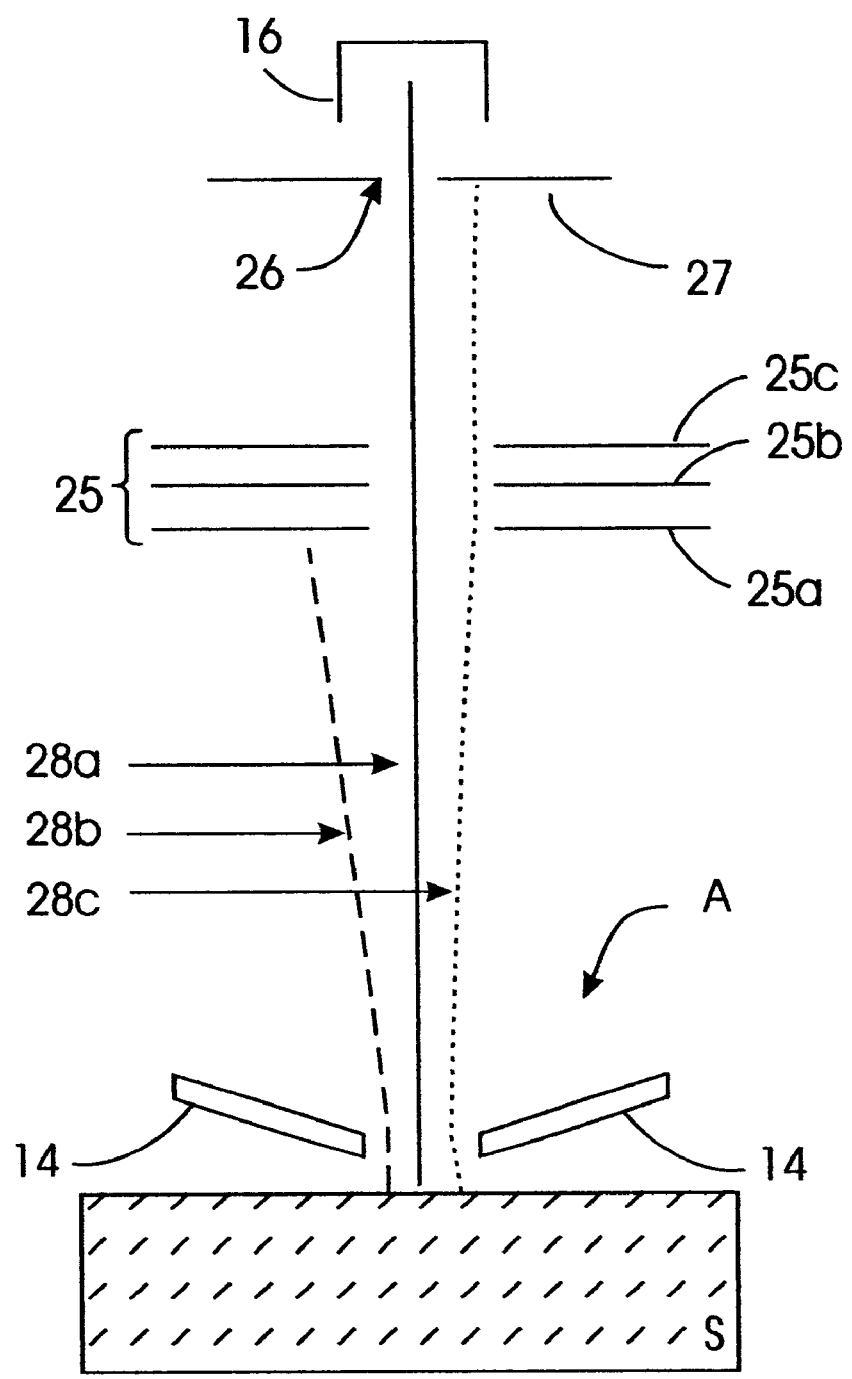
FIG. 3 shows an alternative preferred embodiment of a photoemission scanning-aperture probe microscope according to the present invention.

FIG. 3 shows an arrangement in which a three-element lens 25a–25c of macroscopic elements (not microfabricated) is positioned a distance of millimeters or centimeters from the probe tip. A small pinhole 26 is placed between optical element 25 and photoelectron detector 16 so that electrons emitted from sample S at low energy are focused through pinhole 26 formed in barrier 27. Of course, alternative techniques for selecting the low electron energy component of the emitted electrons can be used., such as electrostatic or magnetic deflection spectrometers.

Lenses 25a–25c and pinhole 26 together act to select only those electrons that both leave from sample S from below the center of aperture A and have low kinetic energy when emitted from sample S. An electron emitted with low kinetic energy from a position on the sample that is directly below the center of aperture A continues through the center of aperture A, through the lenses 25a–25c and into detector 16 (path 28a). A low-energy electron emitted off-center is accelerated at an angle that misses the focusing lens entirely (path 28b). An electron emitted off-center, but with significant velocity in the right direction can enter lens 25, but is not focused through pin-hole 26 (path 28c). It is estimated that for a tip-to-aperture bias of 10 Volts, restricting the kinetic energy of the emitted electrons to less than 0.1 Volt will improve the spatial resolution by a factor of two.

Intense, easily focussable visible and near Uv laser sources are available. The signal is limited only by the necessity for keeping the laser power sufficiently low so sample S does not overheat. For a given laser power, focusing the light to a spot of radius r causes a temperature rise of the sample by a temperature that is inversely proportional to radius r. As the spot size is made smaller under a constraint of holding the surface temperature fixed, the required laser power, P, is inversely proportionally with radius r. Accordingly, the photoemission signal emitted through aperture A, which is proportional to the light intensity, $I=P/r^2$, increases as $1/r$.

For example, consider a blue laser that is focused to a spot diameter of 1 micron onto a thin-film sample on a substrate having a thermal conductivity of 0.2 W/cm/K (the value for sapphire, which is intermediate between aluminum and glass). Most magnetic materials can be heated by 100 K without altering the magnetic structure appreciably. Heating of the thin-film sample of this example by less than 100 K can be achieved using 4 mW of laser power. For a typical quantum efficiency of 0.0003 and a circular dichroism of 5%, the photoemission count rate through a 5 nm aperture is sufficient to enable a 1000×1000 pixel image to be acquired in 6 seconds with a signal to noise ratio of 2:1. The signal level of the laser source can be decreased by more than a factor of 1000 and still allow useful imaging rates. Thus, there is plenty of latitude in selection of laser signal power for improving the spatial resolution by the angular and energy selection constraints of the present invention.

As another example, a monochromatized synchrotron X-ray radiation can be generated and focused to a 50 micron spot to have an intensity of $5 \times 10^{12}$ photons/second. Increasing the intensity by a factor of 10 by using an undulator, and by a factor of 100 by using a zone plate, yields an intensity of $5 \times 10^5$ photons/second in a 5 nm area. Based on a 5% quantum yield, this provides an electron count rate of $2.5 \times 10^4$ sec, which is sufficient for magnetic imaging because the dichroism of the X-ray transitions is as high as 30%.

Figure 4A:
FIG. 4a shows an exemplary image of an unmagnetized Pt—Co multilayer sampled obtained using the imaging technique of the present invention.
Figure 4B:
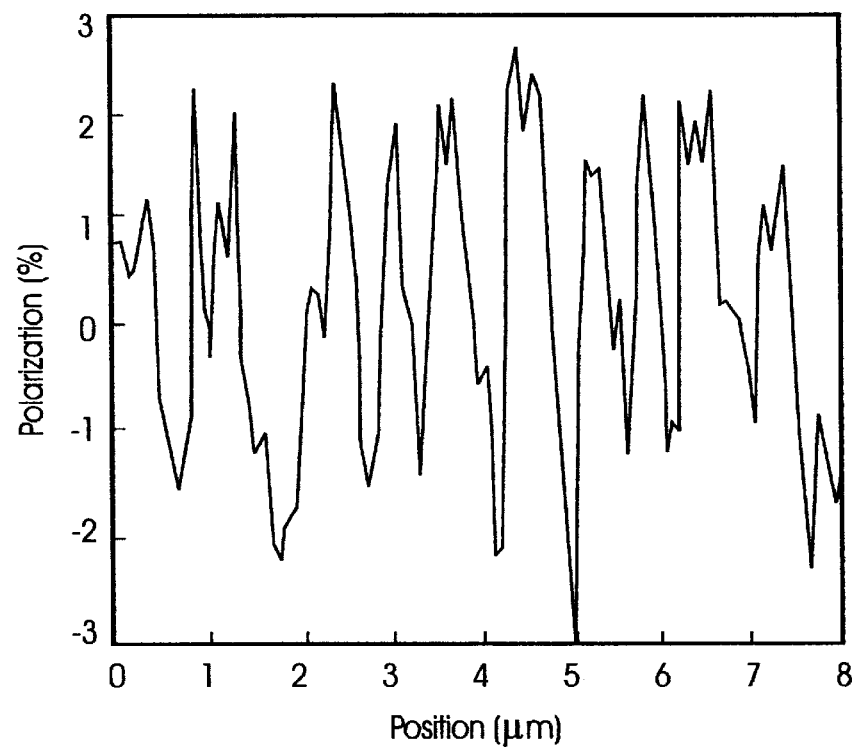

FIG. 4a shows an exemplary image of an unmagnetized Pt—Co multilayer sample obtained using the imaging technique of the present invention. Photoemission was stimulated from the multilayer sample using 1 mW of 457.9 nm light generated by an Ar+ laser. An aperture of 200 nm was drilled by a focussed ion beam. The scanned image shown in FIG. 4a covers an area of 8×4 microns of cesiated 10 nm thick unmagnetized Pt—Co multilayer, which is known to exhibit perpendicular magnetization. The bright and dark regions shown in FIG. 4a have a polarization difference of about 4.5 percent. FIG. 4b shows a line scan of % polarization and a function of position taken from the image along line 40, shown in FIG. 4a. The resolution is at least as good as the 200 nm aperture size.

Another embodiment of the present invention uses thermionic emission of electrons as the source of the ejected electrons. For example, heat 30 is applied sample S shown in FIG. 1, using well-known techniques. Electrons ejected by way of thermionic emission pass through aperture A of probe 14 and are detected by electron detector 16.

While the present invention has been described in connection with the illustrated embodiments, it will be appreciated and understood that modifications may be made without departing from the true spirit and scope of the invention.

What is claimed is:

1. A scanning-aperture electron microscope, comprising:
   a radiation source generating a radiation beam;
   a polarization rotator polarization modulating the radiation beam, the polarization-modulated radiation beam being incident upon a surface of a sample material causing electrons to be ejected from the material, the sample material having at least one magnetic domain, the ejected electrons being ejected from the surface of the sample material in accordance with a polarization of the radiation beam that is incident upon the surface of the sample material and a relative orientation of each magnetic domain;
   a scanning-aperture probe having an aperture, the aperture being positioned in proximity to the surface of the sample material so that electrons ejected from the surface of the sample material pass through the aperture; and
   an electron detector detecting the ejected electrons passing through the aperture.

2. The scanning-aperture electron microscope according to claim 1, wherein the electron detector outputs a signal in response to the detected electrons that is used for imaging magnetic features of the surface of the sample material.

3. The scanning-aperture electron microscope according to claim 2, wherein a resolution of the imaged magnetic features is about equal to a size of the aperture.

4. The scanning-aperture electron microscope according to claim 1, wherein the electron detector outputs a signal in response to the detected electrons that is used for imaging spectroscopic features of the surface of the sample material.

5. The scanning-aperture electron microscope according to claim 4, wherein a resolution of the imaged spectroscopic features is about equal to a size of the aperture.

6. The scanning-aperture electron microscope according to claim 1, further comprising:
   an optical element disposed between the aperture of the scanning-aperture probe and the electron detector; and
   a barrier having a pinhole, the pinhole being disposed between the optical element and the electron detector, the optical element and the pinhole operating together for directing electrons ejected from the surface of the sample material having a predetermined electron energy and having a predetermined emission path to the electron detector.

7. The scanning-aperture electron microscope according to claim 1, wherein the radiation source is a laser.

8. The scanning-aperture electron microscope according to claim 7, wherein the radiation source is a synchrotron.

9. The scanning-aperture electron microscope according to claim 1, wherein the radiation source generates photons.

10. The scanning-aperture electron microscope according to claim 1, wherein the radiation source generates particles.

11. The scanning-aperture electron microscope according to claim 1, wherein the radiation source generates ions.

12. The scanning-aperture electron microscope according to claim 1, wherein the radiation source generates x-rays.

13. The scanning-aperture electron microscope according to claim 1, wherein the radiation source generates visible light.

14. The scanning-aperture electron microscope according to claim 1, wherein the radiation source generates ultraviolet light.

15. The scanning-aperture electron microscope according to claim 1, further comprising a measurement controller generating a trigger signal in response to a magnetic field pulse event applied to the surface of the sample material, and
   wherein the radiation source is responsive to the trigger signal by generating a pulsed radiation beam.

16. A method for generating an image, the method comprising the steps of:
   generating a polarization-modulated radiation beam;
   directing the polarization-modulated radiation beam to a surface of a sample material, the sample material having at least one magnetic domain;
   positioning an aperture of a scanning-aperture probe in proximity to the surface of the sample material so that electrons ejected from the surface of the sample material pass through the aperture, the ejected electrons being ejected from the surface of the sample material in accordance with a polarization of the radiation beam incident upon the surface of the sample material and a relative orientation of each magnetic domain; and
   detecting the ejected electrons passing through the aperture.

17. The method according to claim 16, further comprising the step of outputting a signal in response to the detected electrons that is used for generating an image of magnetic features of the surface of the sample material.

18. The method according to claim 16, wherein a resolution of the imaged magnetic features is about equal to a size of the aperture.

19. The method according to claim 16, further comprising the step of outputting a signal in response to the detected electrons that is used for generating an image of spectroscopic features of the surface of the sample material.

20. The method according to claim 19, wherein a resolution of the imaged spectroscopic features is about equal to a size of the aperture.

21. The method according to claim 16, wherein the step of detecting the electrons passing through the aperture includes the step of detecting electrons ejected from the surface of the sample material that have a predetermined electron energy and having a predetermined emission path.

22. The method according to claim 16, wherein the radiation beam is generated by a laser.

23. The method according to claim 16, wherein the radiation beam is generated by a synchrotron.

24. The method according to claim 16, wherein the radiation beam is a beam of photons.

25. The method according to claim 16, wherein the radiation beam is a beam of particles.

26. The method according to claim 16, wherein the radiation beam is a beam of ions.

27. The method according to claim 16, wherein the radiation beam is a beam of x-rays.

28. The method according to claim 16, wherein the radiation beam is a beam of visible light.

29. The method according to claim 16, wherein the radiation beam is a beam of ultraviolet light.

30. The method according to claim 16, further comprising the step of generating a trigger signal in response to a magnetic field pulse event applied to the surface of the sample material; and generating a pulsed radiation beam in response to the trigger signal, and wherein the step of directing the radiation beam to the surface of the sample material directs the pulsed radiation beam to the surface of the sample material.

* * * * *